(12) United States Patent
Mihara et al.

(10) Patent No.: US 6,319,851 B1
(45) Date of Patent: Nov. 20, 2001

(54) METHOD FOR PACKAGING SEMICONDUCTOR DEVICE HAVING BUMP ELECTRODES

(75) Inventors: Ichiro Mihara, Tachikawa; Osamu Kuwabara, Tokyo, both of (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 09/487,165

(22) Filed: Jan. 19, 2000

(30) Foreign Application Priority Data

Feb. 3, 1999 (JP) .................................................. 11-025971
Sep. 14, 1999 (JP) .................................................. 11-260050

(51) Int. Cl.⁷ ......................... H01L 21/31; H01L 21/469; B05D 5/12; B05C 1/00; G03F 9/00; G03F 7/12; G03C 5/00
(52) U.S. Cl. .......................... 438/778; 438/942; 438/945; 427/96; 118/255; 430/5; 430/308; 430/324
(58) Field of Search .............................. 401/5, 103, 139, 401/143, 200, 261; 427/11, 96; 118/255; 438/778, 942, 945; 430/5, 308, 324

(56) References Cited

U.S. PATENT DOCUMENTS 4,627,988 * 12/1986 Spanjer ...................................... 427/5
5,147,084  9/1992 Behun et al. .
5,478,700 * 12/1995 Gaynes .................................. 430/315
5,847,456 12/1998 Shoji .

FOREIGN PATENT DOCUMENTS 0 993 040  4/2000 (EP) .
3-293740 12/1991 (JP) .

* cited by examiner

*Primary Examiner*—Charles Bowers
*Assistant Examiner*—Nema Berezny
(74) *Attorney, Agent, or Firm*—Frishauf, Holtz, Goodman, Langer & Chick, P.C.

(57) ABSTRACT

A resin sealing film is formed on a silicon substrate by using a printing mask and a squeegee. The side surface in the tip portion of the squeegee is substantially V-shaped, and the printing is performed by pushing the tip portion of the squeegee into the gap between adjacent bump electrodes. As a result, the sealing film is formed in a manner to be depressed in the region between adjacent bump electrodes so as to facilitate the swinging movement of the bump electrodes. It follows that, in a temperature cycle test performed after the silicon substrate is mounted to a circuit substrate, the stress derived from the difference in thermal expansion coefficient between the silicon substrate and the circuit substrate is absorbed by the bump electrode.

20 Claims, 17 Drawing Sheets

METHOD FOR PACKAGING SEMICONDUCTOR DEVICE HAVING BUMP ELECTRODES

BACKGROUND OF THE INVENTION

The present invention relates to a packaging method of a semiconductor device having a plurality of bump electrodes, particularly, to a method of sealing bump electrodes formed on a substrate such as a silicon wafer.

FIGS. 13 to 17 collectively exemplify a method of manufacturing a semiconductor device called CSP (Chip Size Package). As shown in FIG. 13, a structure having a large number of bump electrodes 2 formed on a silicon substrate (semiconductor substrate) 1 of a wafer is disposed in a position-aligned state on an upper surface of a printing table 3. Then, a printing mask 4 is disposed in a positioned-aligned state on the upper surface of the silicon substrate 1. The printing mask 4 comprises a mask body 4a having a thickness slightly larger than the height of the bump electrode 2. A circular open portion 4b slightly smaller than the planar size of the silicon substrate 1 is formed in the mask body 4a.

In the next step, as shown in FIG. 14, a liquid sealing resin is printed on the surface of the substrate within the open portion 4b of the printing mask 4 with a squeegee 5 shaped like a strip so as to form a sealing film 6. In this step, the upper surface of the bump electrodes 2 is covered with the sealing film 6. Then, the upper surface of the sealing film 6 is grinded appropriately so as to expose the upper surface of the bump electrode 2 to the outside, as shown in FIG. 15. Further, a solder ball 7 is formed on the upper surface of the bump electrode 2, as shown in FIG. 16, followed by a dicing treatment so as to obtain individual semiconductor devices.

FIG. 17 is a cross sectional view showing a part of a semiconductor device 10 thus obtained, which is mounted to a circuit substrate 11. In this case, the semiconductor device 10 is mounted to the circuit substrate 11 such that the solder ball 7 is bonded to a connection terminal 12 formed at a predetermined position on the surface of the circuit substrate 11.

In the conventional semiconductor device 10 of the particular construction, the thickness of the sealing film 6 is equal to the height of the bump electrode 2. As a result, each of the bump electrodes 2 is fixed to the sealing film 6 and, thus, is incapable of being deformed. As a result, in a temperature cycle test performed after the semiconductor device 10 is mounted to the circuit substrate 11, the bump electrode 2 is incapable of absorbing the stress derived from the difference in the thermal expansion coefficient between the silicon substrate 1 and the circuit substrate 11, giving rise to a problem that cracks are generated at the bump electrode 2 or the solder ball 7.

BRIEF SUMMARY OF THE INVENTION

An object of the present invention is to provide a method of sealing bump electrodes capable of absorbing the stress acting on each of the bump electrodes and derived from the difference in thermal expansion coefficient.

According to one embodiment of the present invention, there is provided a method of sealing bump electrodes, comprising the steps of preparing a substrate having a number of bump electrodes formed apart from each other; mounting a mask having open portions each corresponding to at least a part of a region between the bump electrodes to the substrate; and forming a sealing film having a thickness smaller than the height of each of the bump electrodes on the mask by moving a squeegee onto the mask.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

First embodiment

Figure 1:
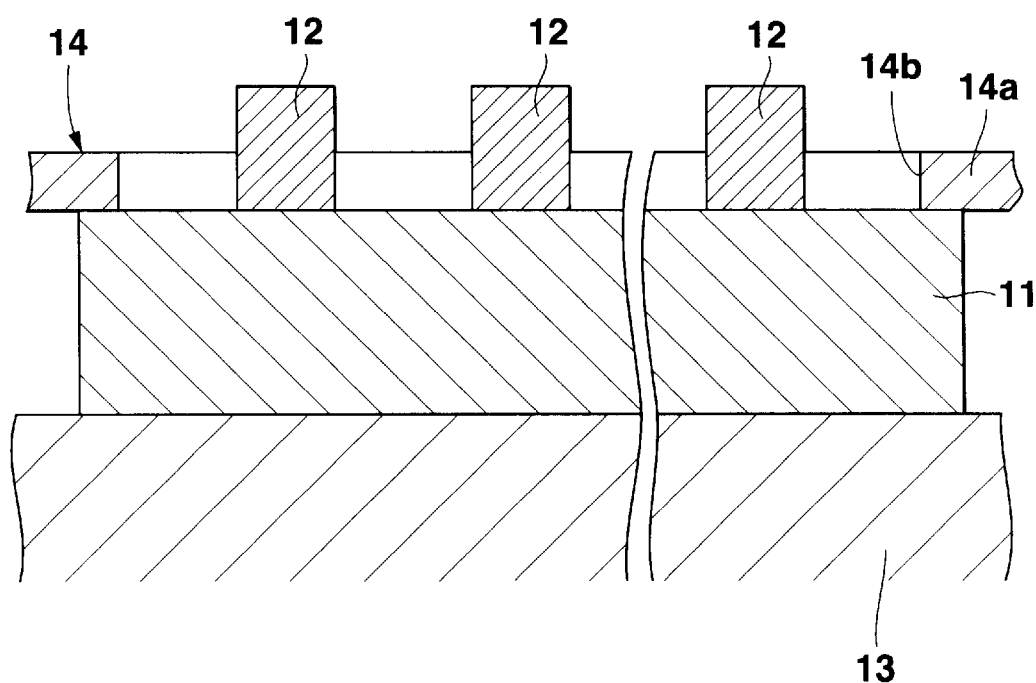
FIG. 1 is a cross sectional view showing in a magnified fashion a gist portion of the initial manufacturing process for explaining a first embodiment of the method of the present invention for packaging a semiconductor device having bump electrodes.
Figure 2:
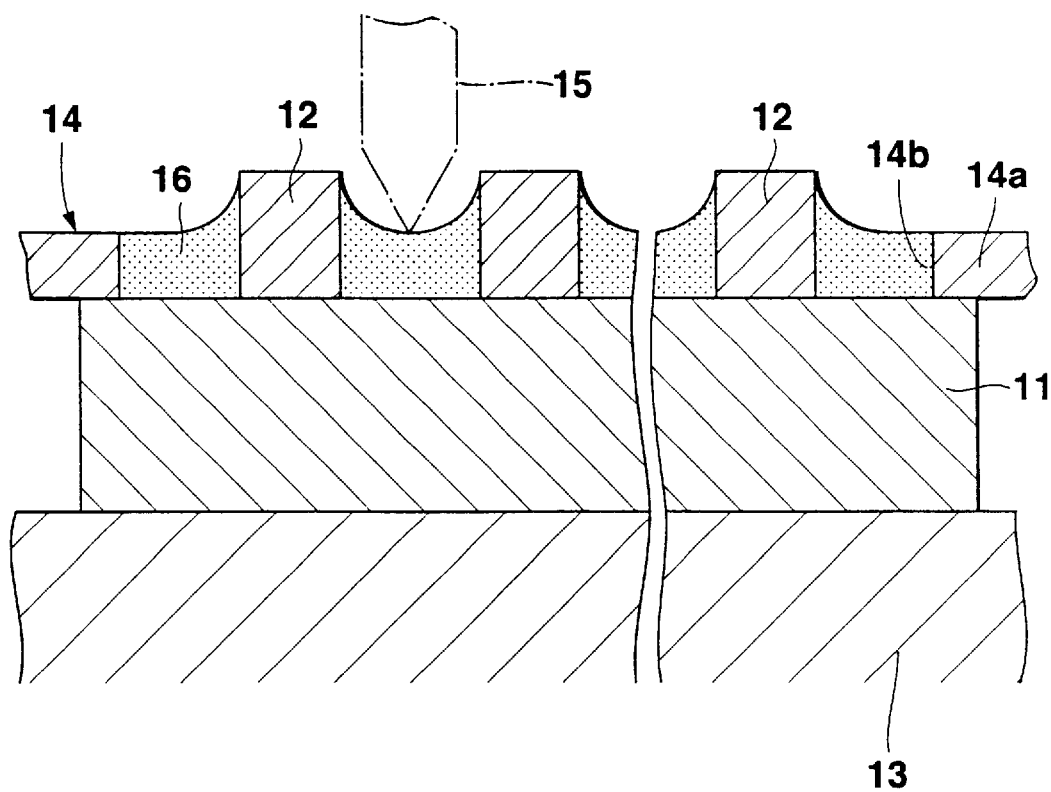
FIG. 2 is a cross sectional view showing in a magnified fashion a gist portion of the manufacturing step following the step shown in FIG. 1.
Figure 3:
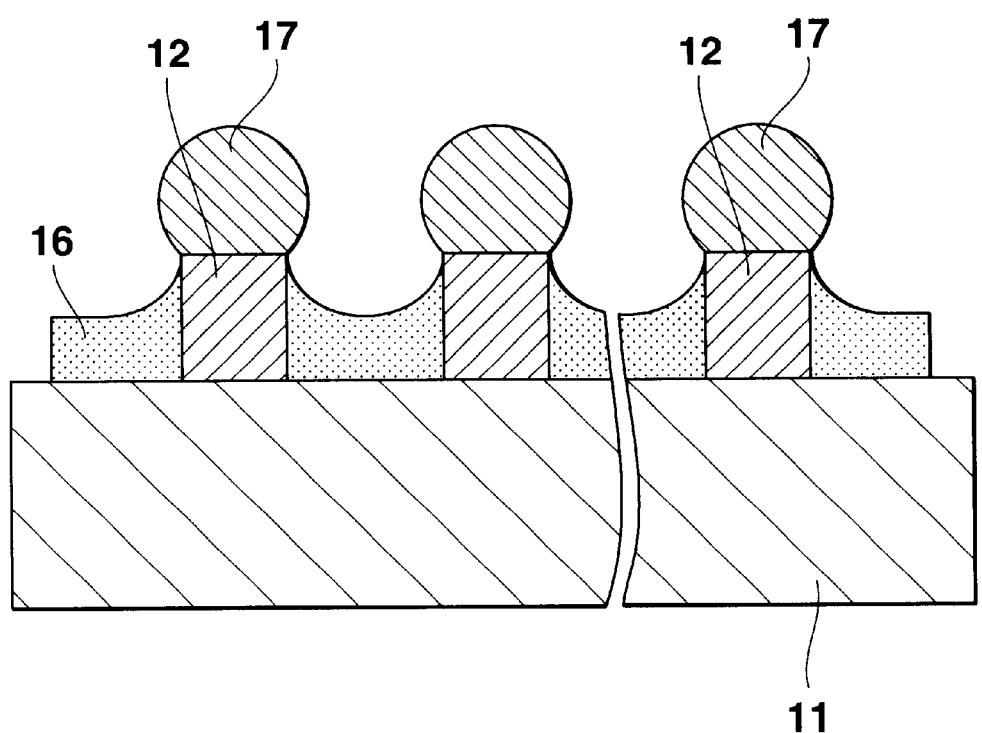
FIG. 3 is a cross sectional view showing in a magnified fashion a gist portion of the manufacturing step following the step shown in FIG. 2.
Figure 5:
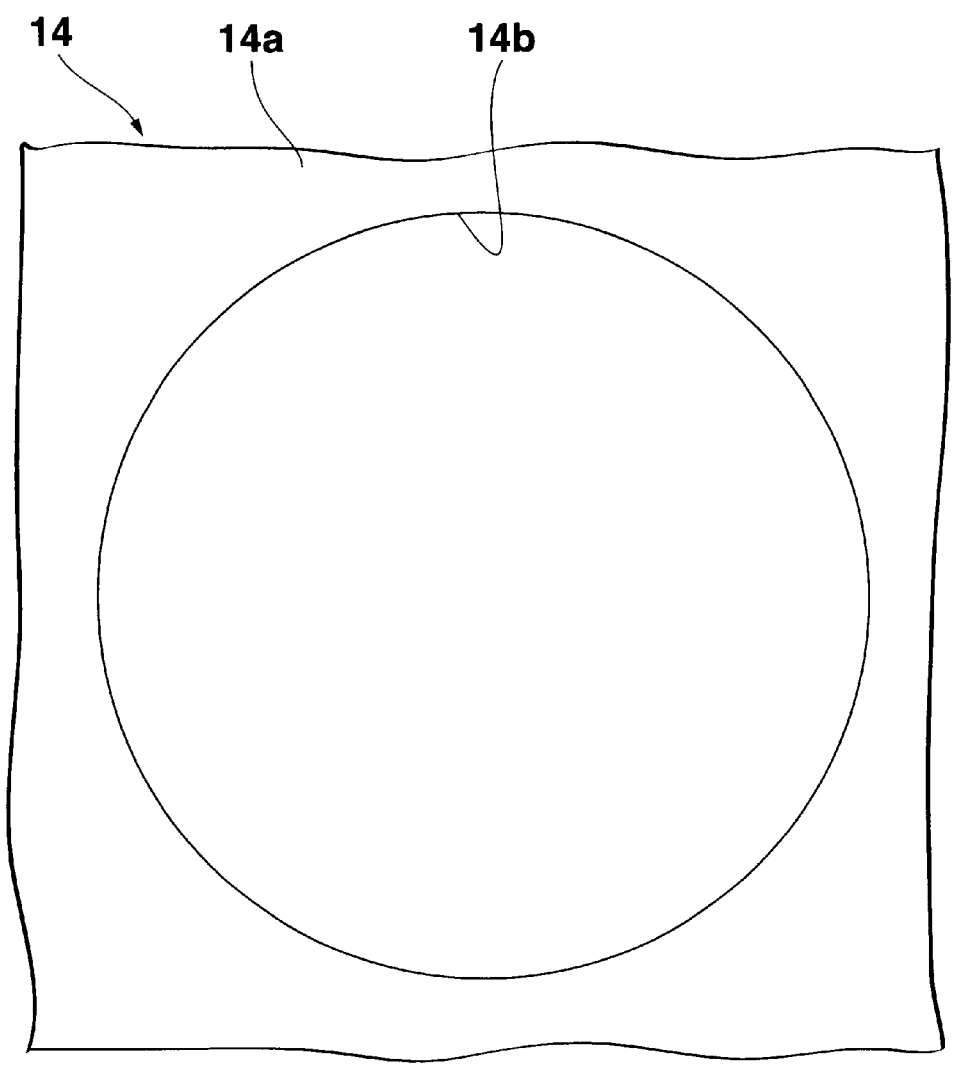
FIG. 5 is a plan view showing a printing mask used in the first embodiment of the present invention.

FIGS. 1 to 3 collectively show a first embodiment of the present invention relating to a sealing method of bump electrodes. In the first step, a structure having a large number of columnar bumps 12 each having a height of 100 to 300 μm arranged a predetermined distance apart from each other on a silicon substrate (semiconductor substrate) 11 of a wafer state is disposed in a position-aligned state on the upper surface of a printing table 13, as shown in FIG. 1. Then, a printing mask 14 is disposed in a position-aligned state on the upper surface of the silicon substrate 11. FIG. 5 is a plan view showing the printing mask 5. The printing mask 14 comprises a mask body 14a having a thickness smaller than the height of the bump electrode 12 and having an outer diameter larger than the planar size of the silicon substrate 11. A circular open portion 14b slightly smaller than the planar size of the silicon substrate 11 is formed in the mask body 14a.

In the next step, as shown in FIG. 2, a liquid sealing resin is printed on the surface of the substrate within the open portion 14b by using a squeegee 15 having a sharp tip portion, i.e., having a tip portion that is substantially V-shaped in the opposite side surfaces. The squeegee 15 extends in a direction perpendicular to the paper and is shaped flat and sharpened to form a V-shape in the right-left direction as described above. The liquid sealing resin has a viscosity of about thousands of cPS (centipoises) to about 300,000 cPS. Also, the squeegee 15 is formed of an elastic plate, e.g., made of urethane rubber. It is desirable for the V-shaped tip portion of the squeegee 15 to have an acute angle of 55° to 80°. Particularly, it is desirable for the tip portion to have an acute angle of about 60°. Also, the hardness of the squeegee 15 should fall within a range of between 55° and 80° as defined in JIS (Japanese Industrial Standards). For performing the printing, the squeegee 15 is reciprocated in a direction substantially perpendicular to the upper surface of the silicon substrate 11. By this printing operation, the tip portion of the squeegee 15 is pushed down into the clearance between adjacent bump electrodes 12 arranged in the running direction of the squeegee 15. As a result, the sealing film 16 has a thickness smaller than the height of the bump electrode 12 in the clearance between adjacent bump electrodes 12 in the running direction of the squeegee 15. In other words, the sealing film 16 is formed in a manner to be depressed in a region between adjacent bump electrodes 12. On the other hand, the thickness of the sealing film 16 in a portion positioned between adjacent bump electrodes arranged in a width direction perpendicular to the running direction of the squeegee 15 is smaller than the thickness of the sealing film in the running direction of the squeegee 15. However, since the squeegee 15 is elastic, the squeegee 15 partly enters the clearance between the bump electrodes arranged in the width direction. Therefore, it may be of no difficulty to understand that the thickness of the sealing film in the width direction is smaller than the height of the =1; bump electrode. In order to further decrease the film thickness between adjacent bump electrodes in the width direction to, for example, a level equal to the film thickness in a region between adjacent bump electrodes arranged in the running direction of the squeegee 15, the squeegee 15 alone is run without performing the resin printing in the width direction at a height equal to that in the case of the running direction. In the case where the sealing film 16 is formed on the upper surfaces of bump electrodes 12, the sealing film 16 on and in the vicinity of bump electrodes 12 is grinded or etched to expose the upper surface of the bump electrodes 12 to the outside. Then, solder balls 17 are formed on the upper surfaces of the bump electrodes 12, as shown in FIG. 3, followed by applying a dicing treatment so as to obtain individual semiconductor devices.

Figure 4:
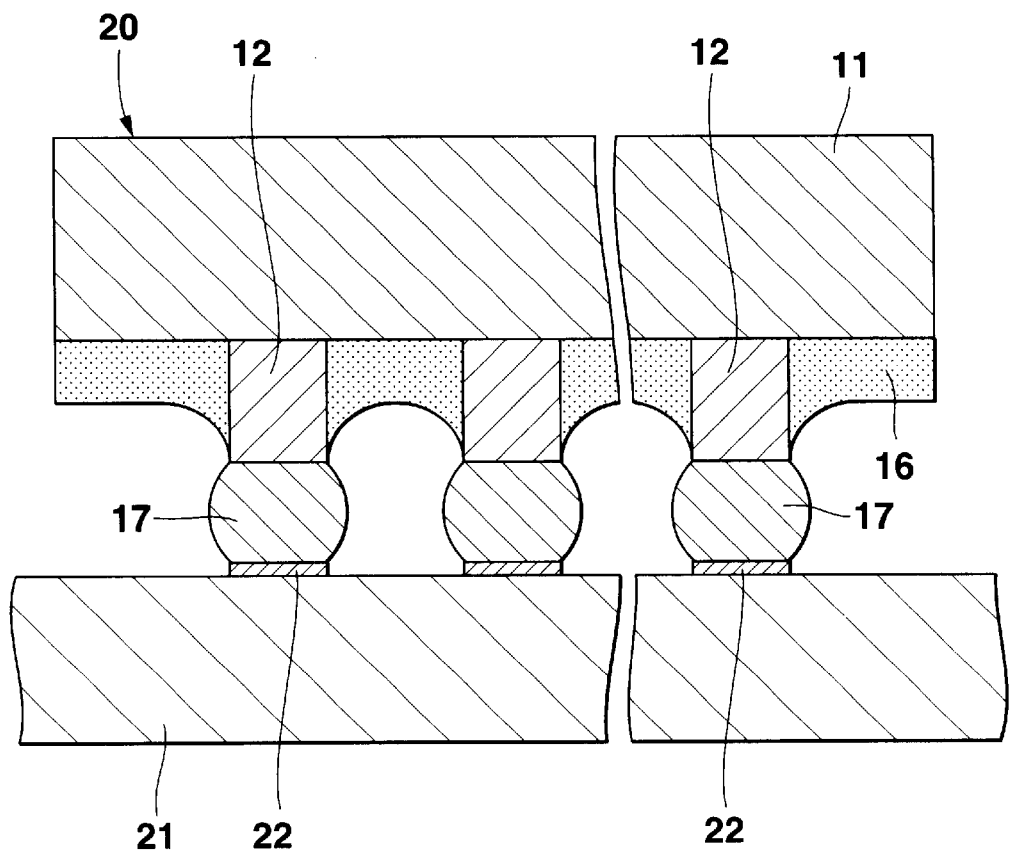
FIG. 4 is a cross sectional view showing in a magnified fashion the state that the semiconductor device as shown in FIG. 3 is disposed on a circuit substrate.

FIG. 4 is a cross sectional view showing the state that the semiconductor device 20 thus obtained is disposed on a circuit substrate 21. In this case, the semiconductor device 20 is mounted to the circuit substrate 21 such that the solder balls 17 are bonded to a connection terminal 22 formed at a predetermined portion on the upper surface of the circuit substrate 21.

In the semiconductor device 20 thus prepared, the sealing film 16 is formed so as to be depressed in a portion between adjacent bump electrodes 12 so as to facilitate the swinging movement of the bump electrodes 12. As a result, even in a thermal cycle test performed after the semiconductor device 20 is mounted to the circuit substrate 21, the stress derived from the difference in the thermal expansion coefficient between the silicon substrate 11 and the circuit substrate 21 is absorbed by the bump electrodes 12, making it possible to prevent crack occurrence at the bump electrodes 12 and the solder balls 17.

Figure 6:
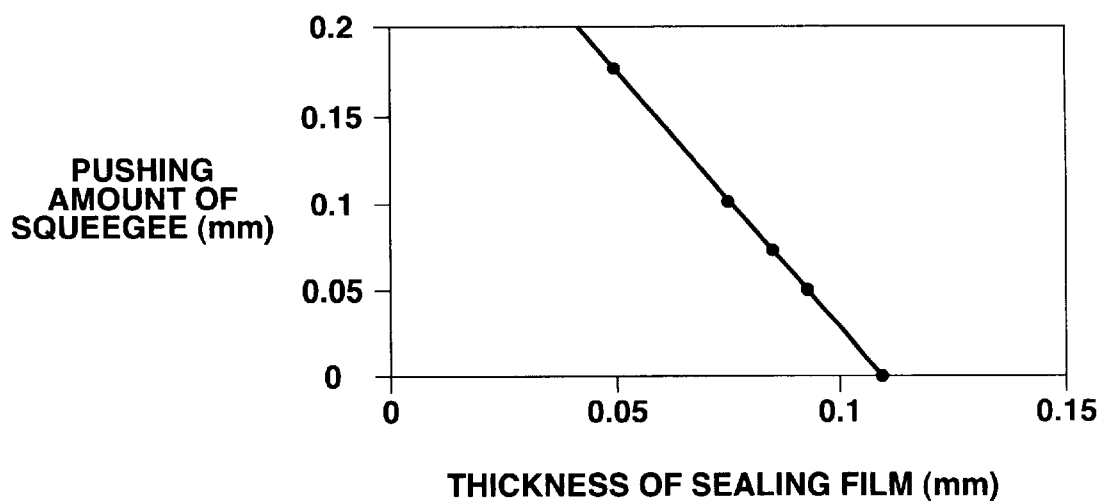
FIG. 6 is a graph showing the relationship between the pushing amount of a squeegee and the thickness of the sealing film.

The relationship between the pushing amount (mm) of the squeegee 15 and the thickness of the sealing film 16 (mm) has been examined, with the results as shown in FIG. 6. In this case, the pushing amount of the squeegee 15 represents the pushing amount of the tip of the squeegee 15 into the clearance between adjacent bump electrodes 12 as measured from the upper surface providing a reference plane of the bump electrode 12 having a height of about 110 μm. On the other hand, the thickness of the sealing film 16 represents the thickness at the most depressed point between adjacent bump electrodes 12. As apparent from FIG. 6, the thickness of the sealing film 16 is inversely proportional to the pushing amount of the squeegee 15. It follows that the thickness of the sealing film 16 can be controlled easily by adjusting the pushing amount of the tip portion of the squeegee 15 into the clearance between adjacent bump electrodes 12.

As described previously, the squeegee 15 is formed of a relatively soft urethane rubber, and the side surface in the tip portion of the squeegee 15 is substantially V-shaped. Therefore, even if the squeegee 15 is reciprocated under the condition that the squeegee 15 is pushed down in a vertical state into the clearance between adjacent bump electrodes 12, it is possible to prevent substantially completely the bump electrodes 12 from being damaged.

Where the printing is performed while pushing the squeegee 15 into the clearance between adjacent bump electrodes, the printing mask 14, which is thin, is deformed when the squeegee 15 is moved to an edge portion of the printing mask 14, with the result that the sealing film 16 is rendered nonuniform in thickness. A method of packaging a silicon substrate, which is capable of dealing with this difficulty, will now be described in detail with reference to FIGS. 7A to 7E.

Figure 7A:
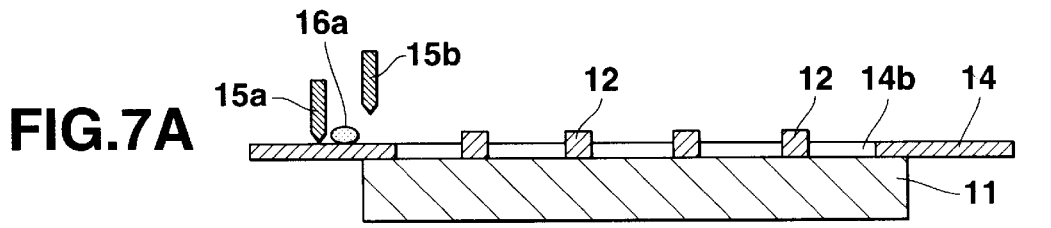
FIGS. 7A to 7E are cross sectional views collectively showing a method of the present invention for packaging a semiconductor device.

As shown in FIG. 7A, prepared is a screen printing machine provided with two squeegees 15a and 15b arranged a predetermined distance apart from each other. In this case, the left squeegee 15a is for the forward movement, and the right squeegee 15b is for the backward movement. These two squeegees 15a, 15b are located at the print starting position on the side of the left edge. The squeegee 15a for the forward movement is moved downward at the print starting point so as to be located at the lowermost position at which the tip of the squeegee 15a is brought into contact with the upper surface of the printing mask 14. On the other hand, the squeegee 15b for the backward movement is located at an elevated position slightly apart from the upper surface of the printing mask 14. In this case, the amount of the downward movement of the squeegee 15a for the forward movement corresponds to the squeegee pushing amount determined in advance.

Figure 7B:
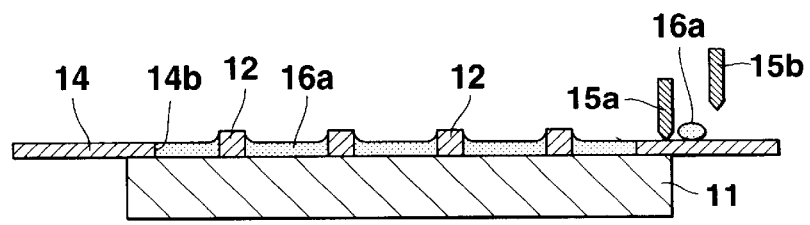
Figure 7C:
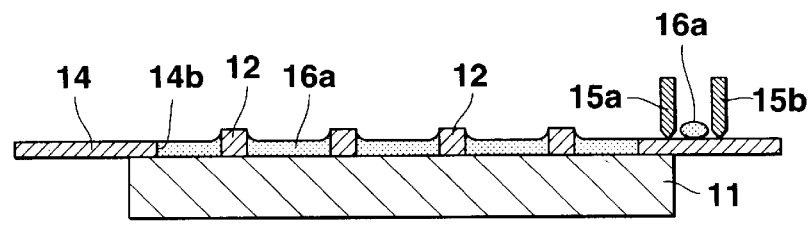

Then, a liquid sealing resin 16a is supplied onto that region of the upper surface of the printing mask 14 which is positioned between the two squeegees 15a and 15b. Under this condition, the two squeegees 15a and 15b are moved to the right so as to allow the first squeegee 15a to print the liquid sealing resin 16a within the open portions 14b of the printing mask 14, as shown in FIG. 7B. When the two squeegees 15a, 15b are moved to reach a print ending position on the side of the right side, the movement of these two squeegees 15a, 15b is stopped. Then, the second squeegee 15b for the backward movement is moved downward so as to be brought into contact with the surface of the printing mask 14, as shown in FIG. 7C. In this case, the amount of the downward movement of the second squeegee 15b corresponds to the squeegee pushing amount determined in advance.

Figure 7D:
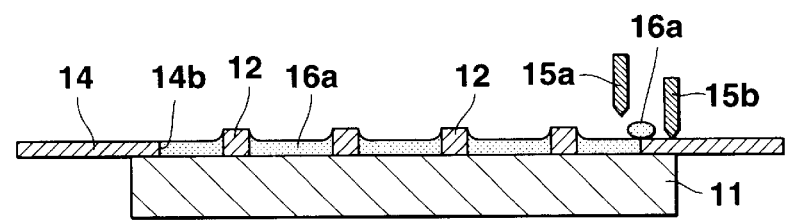
Figure 7E:
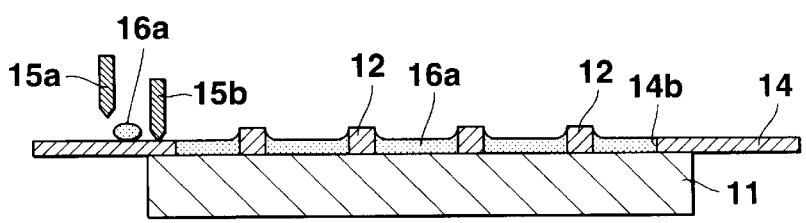

Then, the squeegees 15a, 15b are somewhat moved to the left such that the first squeegee 15a alone is positioned over an edge portion of the silicon substrate 11, as shown in FIG. 7D. The position shown in the drawing is the print starting position on the side of the right edge. In this position, the first squeegee 15a is located in an elevated point slightly apart from the upper surface of the printing mask 14. Under this condition, the two squeegees 15a, 15b are moved to the left so as to permit the second squeegee 15b to print the liquid sealing resin 16a within the open portions 14b of the printing mask 14, as shown in FIG. 7E, thereby finishing the printing step of the liquid sealing resin 16a.

Figure 8:
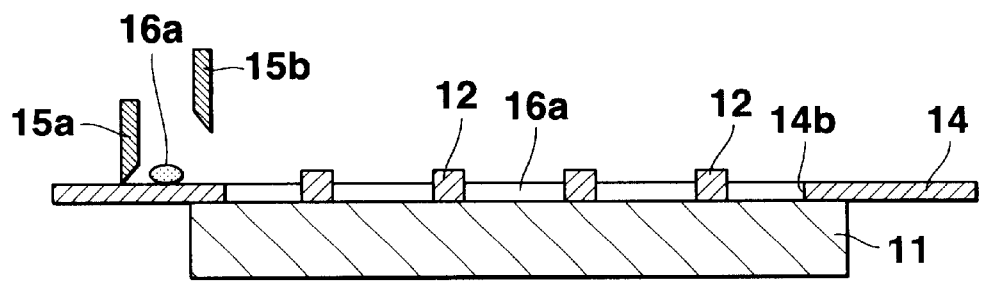
FIG. 8 is a cross sectional view showing a modification of the squeegee used in the first embodiment of the present invention.

As described above, the second squeegee 15b is moved downward so as to be brought into contact with the upper surface of the printing mask 14, as shown in FIG. 7C and, then, the second squeegee 15b, which is kept in contact with the upper surface of the printing mask 14 positioned on the silicon substrate 11, is moved to the left. Further, when the second squeegee 15b is positioned inside the edge of the silicon substrate 11, the first squeegee 15a is moved upward, as shown in FIG. 7D. It should be noted in this connection that, where the first squeegee 15a is moved upward under the state shown in FIG. 7B, followed by moving downward the second squeegee 15b so as to be brought into contact with the upper surface of the printing mask 14, the printing mask 14 is caused to float by the contact force of the second squeegee 15b with the upper surface of the printing mask 14. As a result, the liquid sealing resin 16a that was already printed is caused to flow into a region below the lower surface of the printing mask 14, thereby causing the printing mask 14 to float. It follows that the thickness of the liquid sealing resin 16a is rendered larger than the height of the bump electrode 12. Also, the floating of the printing mask 14 makes it impossible to perform the printing continuously. It is desirable for the liquid sealing resin 16a after the curing to have a high viscosity of 500,000 to 1,500,000 cPS. However, where the liquid sealing resin 16a has such a high viscosity, the liquid sealing resin tends to be printed in a waved fashion in the printing step with the squeegees, resulting in failure to achieve a uniform film thickness. In such a case, it is desirable to perform the printing under the condition that the viscosity of the liquid sealing resin 16a is lowered to an appropriate value, e.g., scores of thousands to hundreds of thousands of cPS, by, for example, heating the liquid sealing resin 16a before the printing step or by heating in advance the silicon substrate 1. Also, in the embodiment described above, the bump electrode 12 is formed in direct contact with the silicon substrate 11. However, the method of forming the sealing film in the present invention is highly adapted for use in a semiconductor device constructed such that a wiring is formed on the silicon substrate 11 with an insulating film interposed therebetween, and bump electrodes are arranged to form a matrix on the silicon substrate 11 by forming the bump electrodes on one end of the wiring. Further, in the first embodiment described above, the side surface in the tip portion of each of the two squeegees 15a, 15b is substantially V-shaped. However, it is not absolutely necessary for the side surface to be V-shaped. Alternatively, it is possible for the left side surface in the tip portion of the squeegee 15a for the forward movement to constitute a vertical plane, with the right side surface inclined downward toward the vertical left side surface, as shown in FIG. 8. On the other hand, it is possible for the right side surface in the tip portion of the squeegee 15a for the backward movement to constitute a vertical plane, with the left side surface inclined downward toward the vertical right side surface. In this case, the forward printing and the backward printing may be performed with the squeegees 15a, 15b held upright relative to the upper surface of the silicon substrate 11. Alternatively, the forward printing and the backward printing may be performed with the tip portions of the squeegees 15a, 15b inclined by the same angle relative to a plane perpendicular to the upper surface of the silicon substrate 11.

Second embodiment

FIGS. 9A to 9D and 10 are directed to a method of sealing a bump electrode according to a second embodiment of the present invention. The printing mask 14 in this embodiment comprises a mask body 14a having a thickness larger than the height of the bump electrode 12. A circular concave portion 14d slightly smaller than the planar size of the silicon substrate 11 is formed in the lower surface of the mask body 14a. The portion corresponding to the bottom wall of the concave portion 14d constitutes a thin wall portion 14c. The depth of the concave portion 14d is substantially equal to the height of the bump electrodes 12. A plurality of slits open portion 14e each having a width smaller than the distance D between adjacent bump electrodes 12 are formed in the thin wall portion 14c of the printing mask 14 such that the slit 14e is positioned between the adjacent bump electrodes 12. How to prepare a package by printing a liquid sealing resin on the silicon substrate 11 will now be described.

Figure 9A:
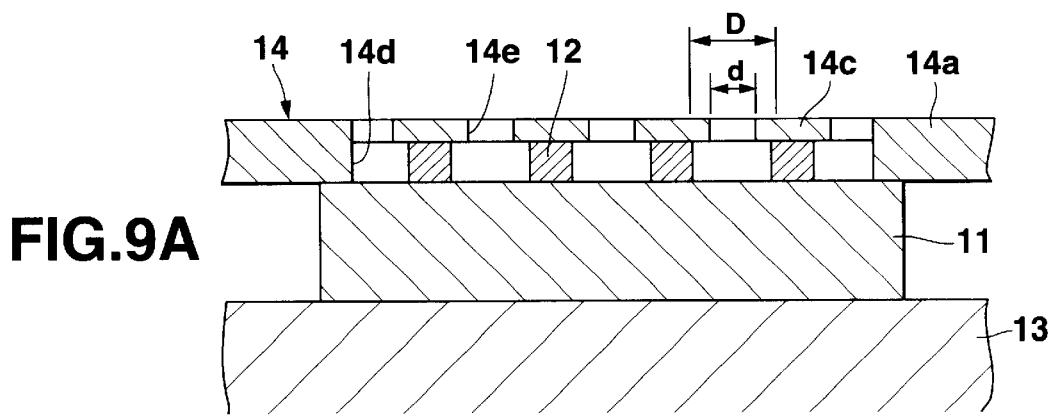
FIGS. 9A to 9D are cross sectional views showing in a magnified fashion the gist portions of the steps of a packaging method according to a second embodiment of the present invention.

In the first step, the silicon substrate 11 is disposed in a position-aligned fashion on the printing stage 13, followed by disposing in a position-aligned fashion the printing mask 14 on the upper surface of the silicon substrate 11, as shown in FIG. 9A. In this state, the upper surfaces of the bump electrodes 12 are covered with the thin wall portion 14c of the printing mask 14.

Figure 9B:
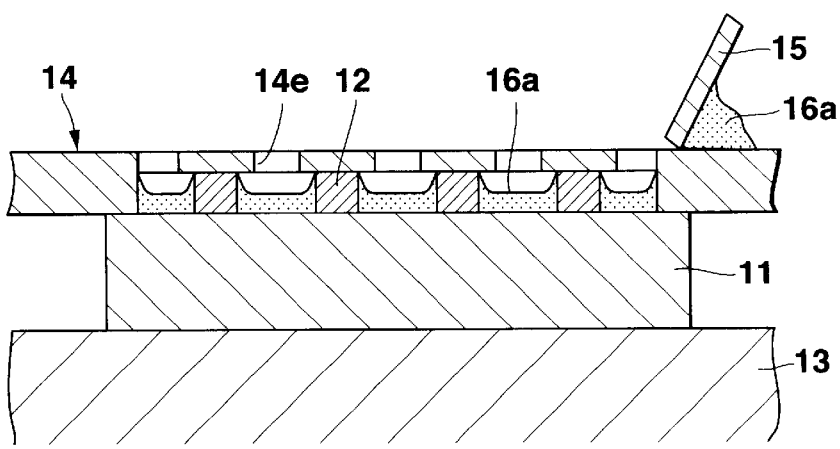

In the next step, the squeegee 15 is moved along the printing mask 14 from one end to the other end so as to print the liquid sealing resin 16a within the slits 14e of the printing mask 14, followed by curing the liquid sealing resin 16a so as to form the sealing film 16, as shown in FIG. 9B.

Figure 9C:
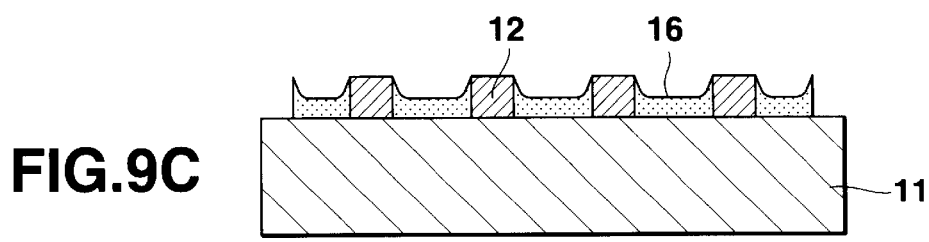
Figure 9D:
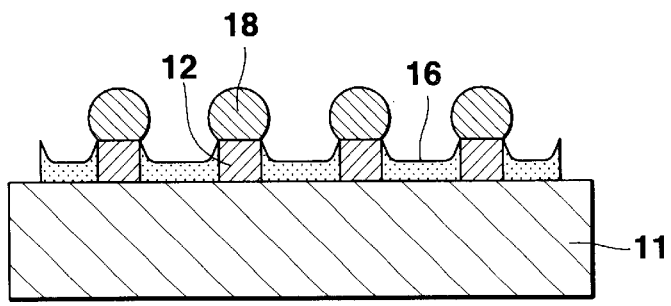
Figure 10:
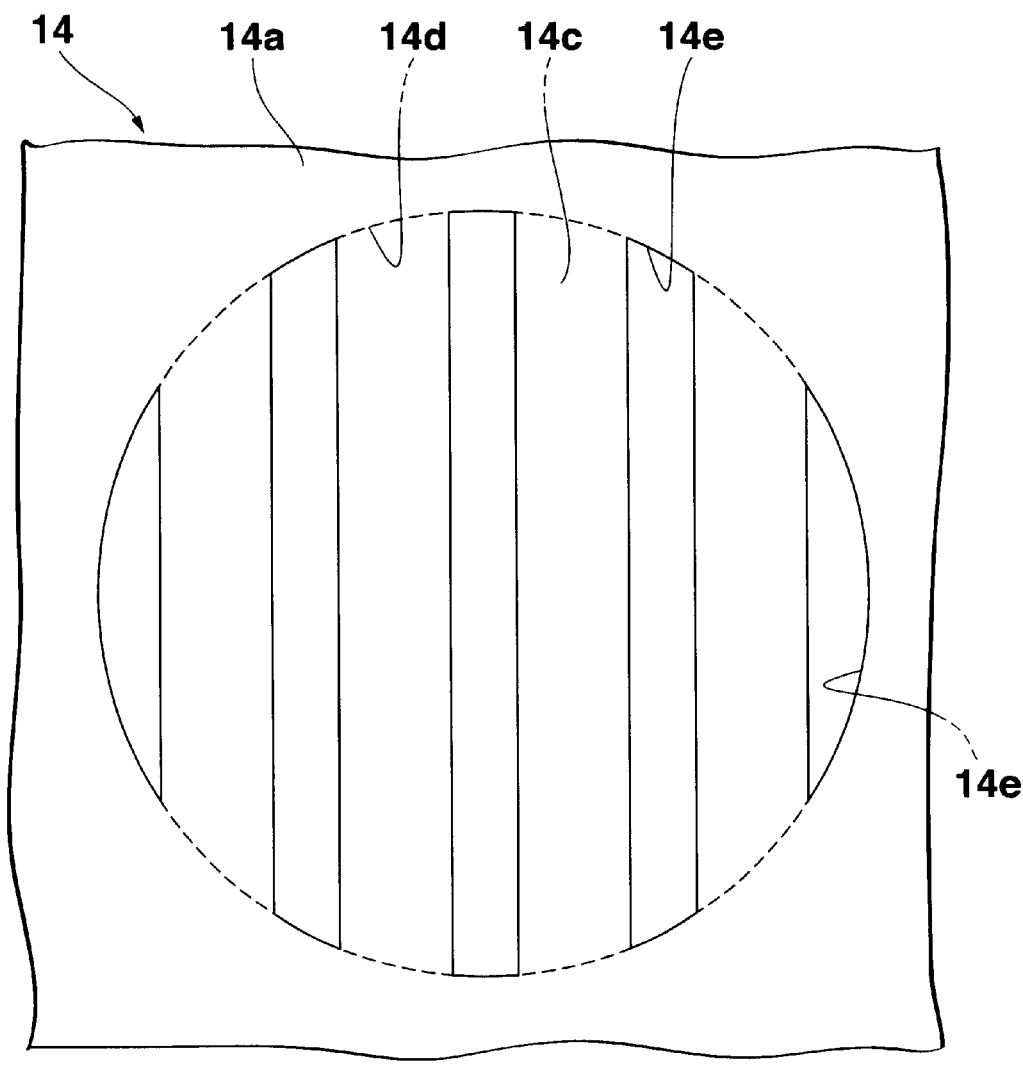
FIG. 10 is a plan view showing a mask used in the second embodiment of the present invention.

It should be noted that the width d of the slit 14e of the printing mask 14 is appropriately smaller than the distance D between adjacent bump electrodes 12 as described previously. Therefore, the amount of the liquid sealing resin 16a printed through the slit 14e in that region of the silicon substrate 11 which is positioned between adjacent bump electrodes is controlled appropriately. In addition, the printed liquid sealing resin 16a is fluidized by its surface tension so as to cover the side surface of the bump electrode 12. It follows that, in this case, the upper surface of the bump electrode 12 is not covered with the resin sealing film 16a, and the thickness of the sealing film 16 positioned between adjacent bump electrodes 12 is made appropriately smaller than the height of the bump electrode 12, as shown in FIG. 9C. It follows that the surface of the sealing film 16 need not be grinded or etched. Then, a solder ball 18 is formed on the upper surface of the bump electrode 12, as shown in FIG. 9D, followed by applying a dicing treatment so as to obtain individual semiconductor devices.

Third embodiment

Figure 11:
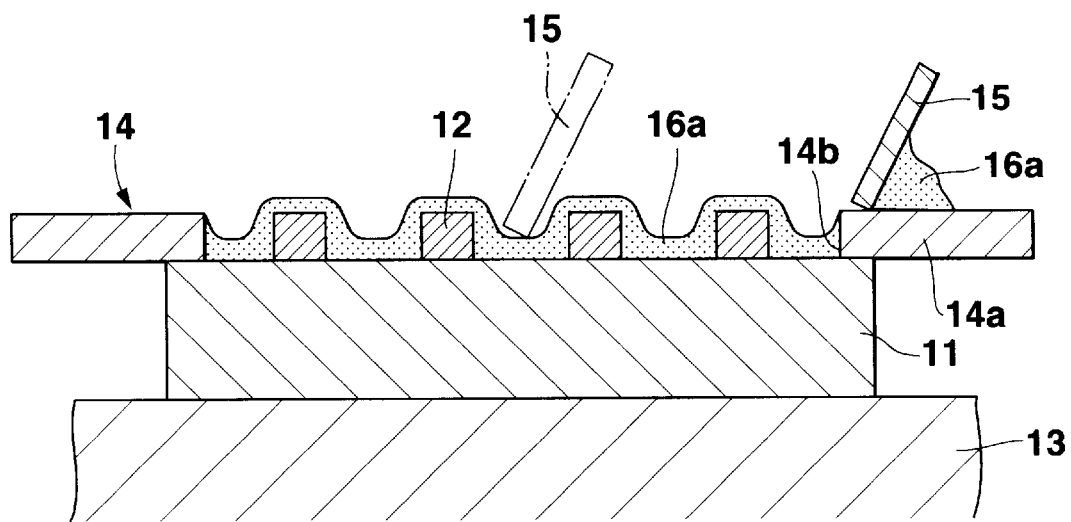
FIG. 11 is a cross sectional view showing in a magnified fashion a packaging method according to a third embodiment of the present invention.
Figure 12:
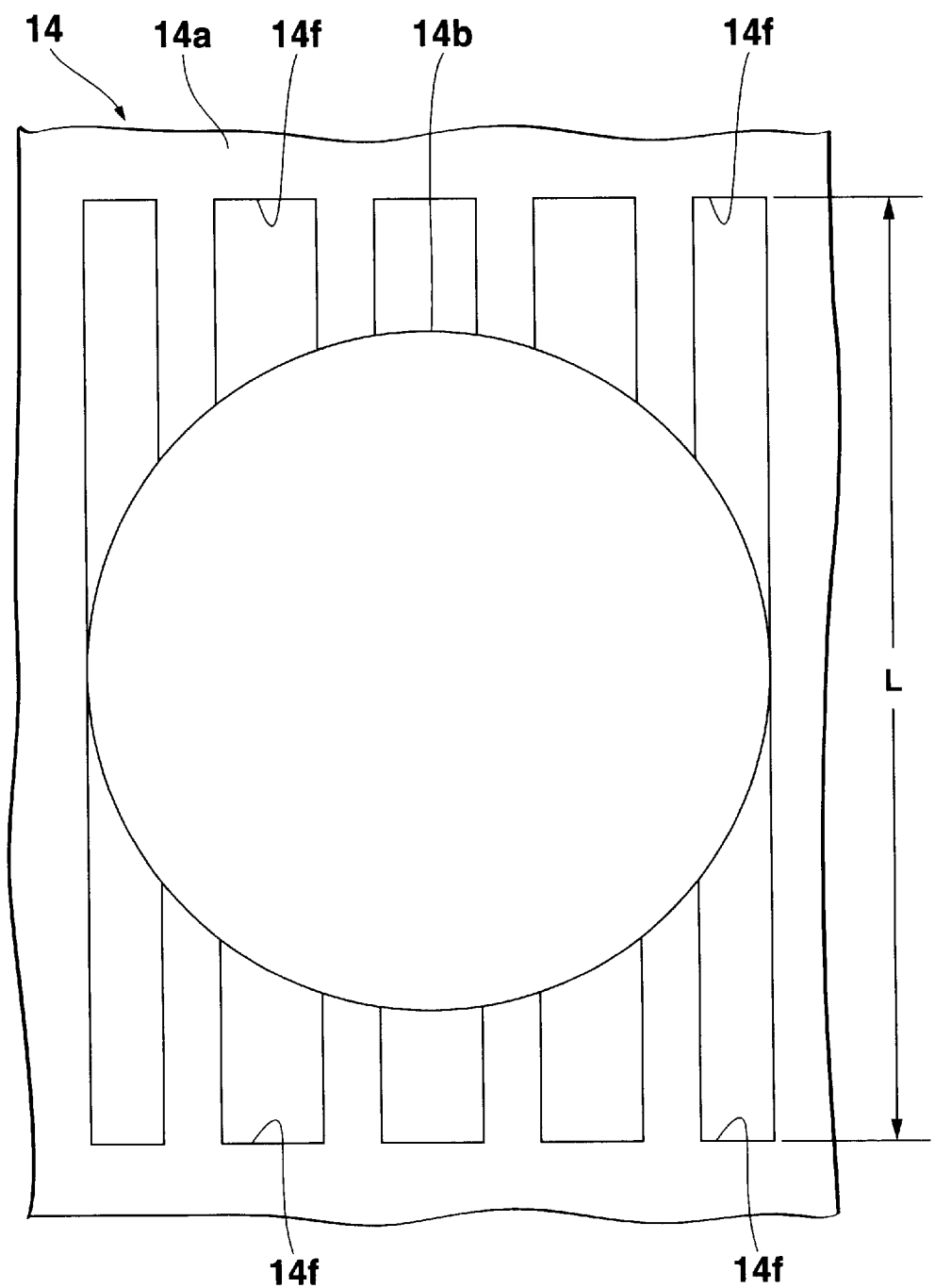
FIG. 12 is a plan view showing a printing mask used in the third embodiment of the present invention.
Figure 13:
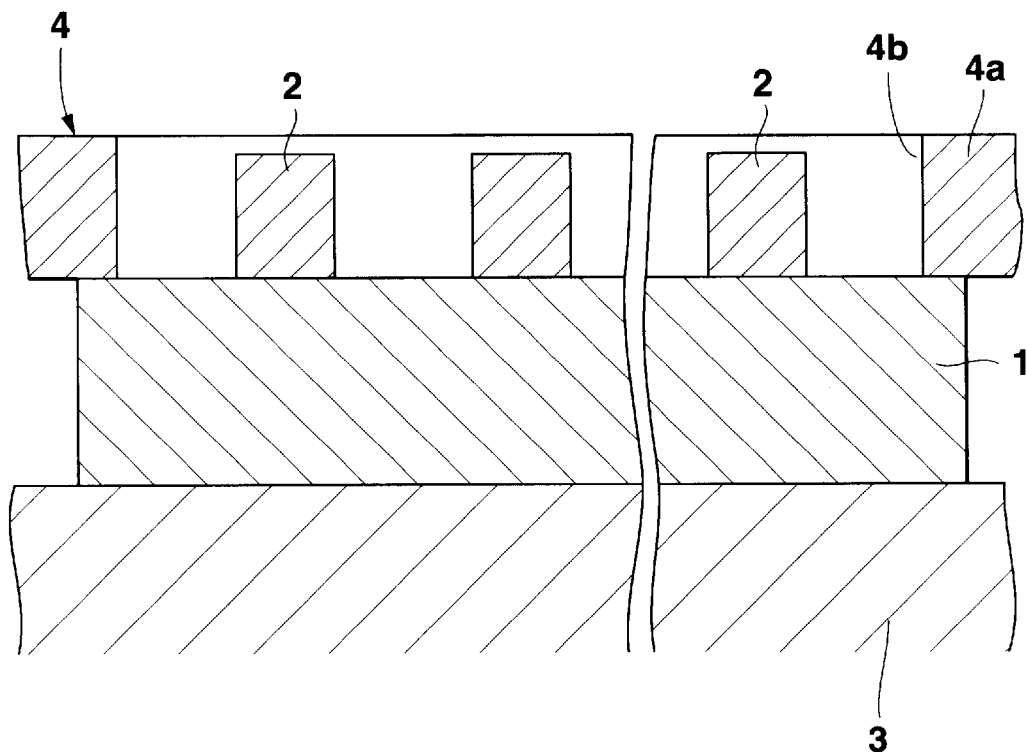
FIG. 13 is a cross sectional view showing in a magnified fashion the initial manufacturing step in the conventional packaging method of a semiconductor device.
Figure 14:
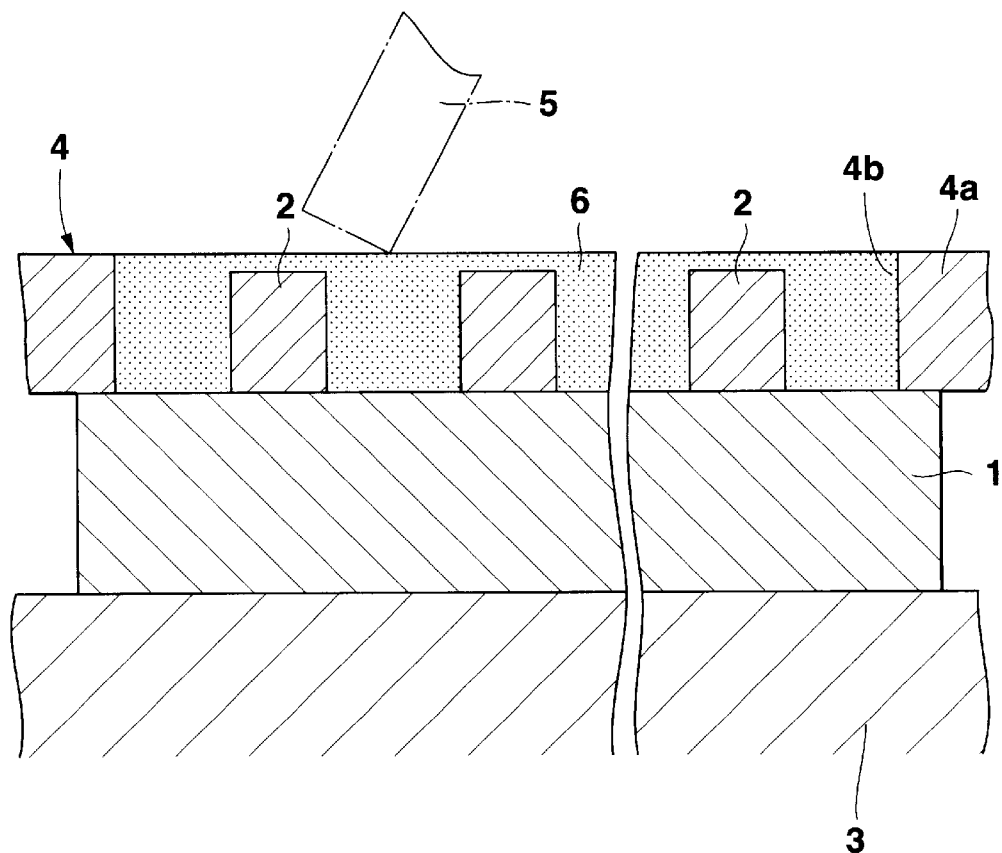
FIG. 14 is a cross sectional showing in a magnified fashion the manufacturing step following the step shown in FIG. 13.
Figure 15:
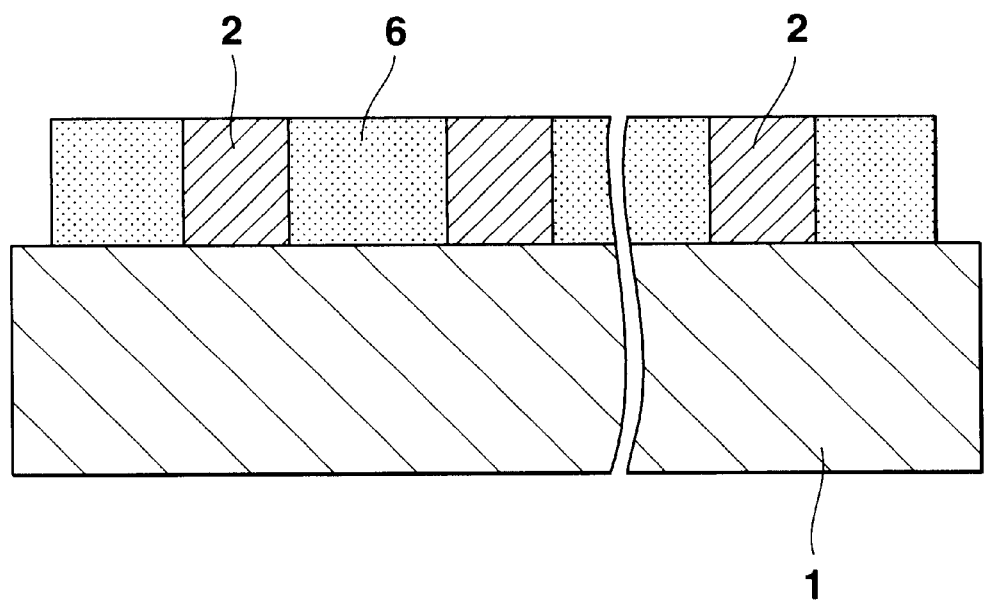
FIG. 15 is a cross sectional showing in a magnified fashion the manufacturing step following the step shown in FIG. 14.
Figure 16:
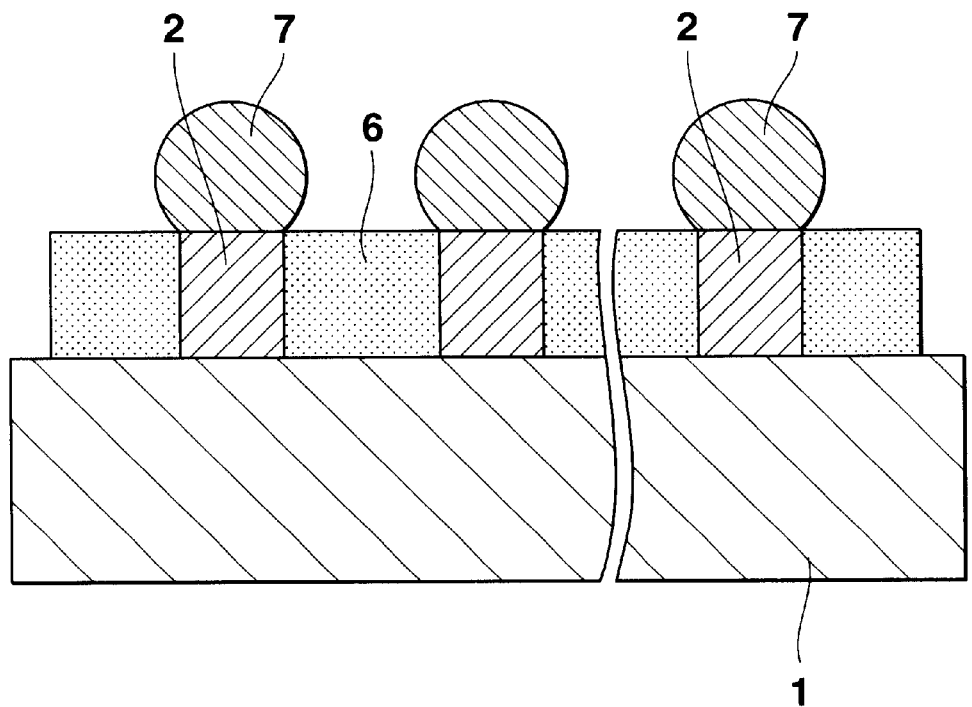
FIG. 16 is a cross sectional view showing in a magnified fashion the gist portion of the manufacturing step following the step shown in FIG. 15.
Figure 17:
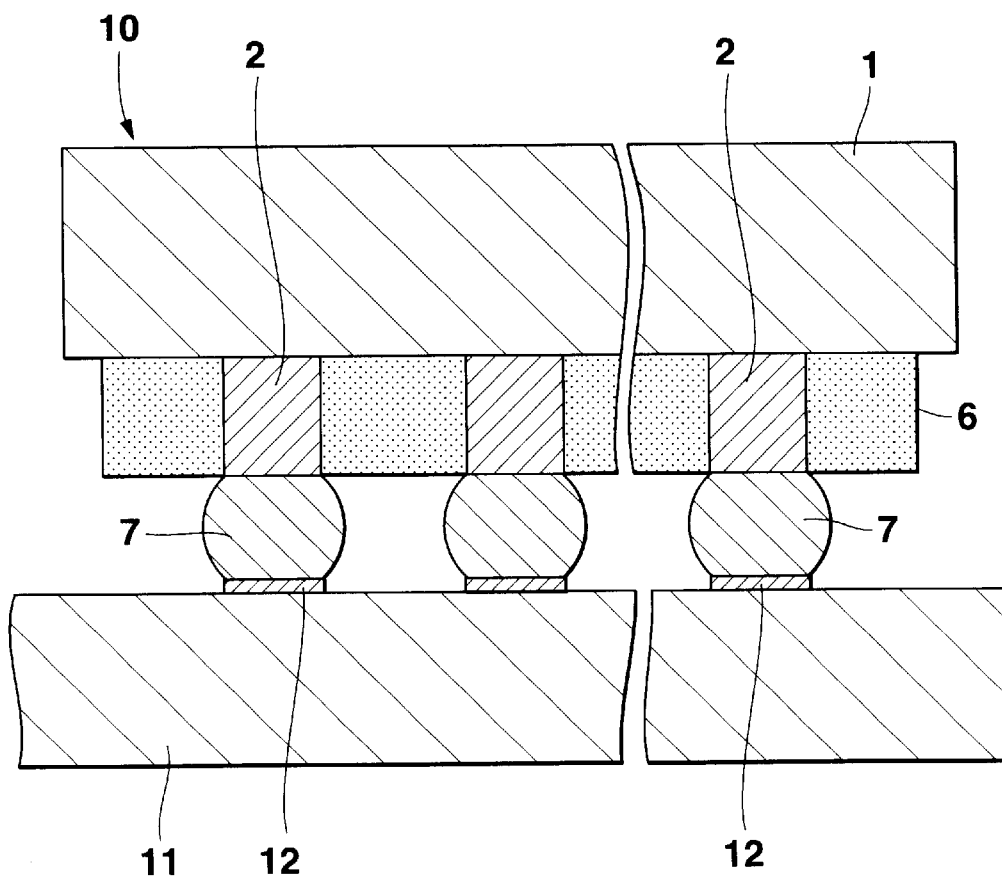
FIG. 17 is a cross sectional view showing in a magnified fashion the state that the semiconductor device shown in FIG. 16 is mounted to a circuit substrate.

FIGS. 11 and 12 are directed to a third embodiment of the present invention relating to a method of sealing a bump electrode. In this embodiment, it is possible for the thickness of the printing mask 14 to be equal to, smaller than or larger than the height of the bump electrode 12. However, one of the printing stage 13 and the squeegee 15 must be moved in a vertical direction in accordance with the arrangement of the bump electrodes 12. In this case, the printing mask 14 comprises the mask body 14a. A circular open portion 14b slightly smaller than the diameter of the silicon substrate 11 is formed in the mask body 14a. Also, a groove 14f is formed between adjacent bump electrodes 12 on the upper side around the open portion 14b of the printing mask 14. The entire length L of the groove 14f is larger than the length of the squeegee 15. The thickness or depth of the groove 14f formed in the printing mask 14 is, for example, about 30 μm to 80 μm where the height of the bump electrode 9 is about 100 μm to 150 μm.

The sealing method of the bump electrode according to the third embodiment will now be described. If the squeegee 15, which is kept pressed against the upper surface of the printing mask 14, is moved from the left side to the right side in the drawing of FIG. 11 together with the liquid sealing resin 16a, with the printing stage 13 kept moved in a vertical direction, the squeegee 15 is moved downward in the position of the groove 14f of the printing mask 14 as denoted by a dot-and-dash line in FIG. 11. As a result, the distance between the squeegee 15 and the silicon substrate 11 is diminished so as to decrease the thickness of the liquid sealing resin 16a in the region between adjacent bump electrodes 12. In this fashion, the liquid sealing resin 16a is printed by the squeegee 15 within the open portion 14b of the printing mask 14, followed by curing the sealing resin 16a so as to form the sealing film 16. What should be noted is that the upper surfaces of the bump electrodes 12 are covered with the sealing film 16. However, the thickness of the sealing film 16 in the region between adjacent bump electrodes 12 is made smaller than the height of the bump electrodes 12. Then, the sealing film 16 on and in the vicinity of the bump electrode 12 is grinded or etched so as to expose the upper surfaces of the bump electrodes 12 to the outside. In the next step, solder balls (not shown) are formed on the upper surfaces of the bump electrodes 12, followed by applying a dicing treatment so as to obtain individual semiconductor devices.

As described above, the sealing film is formed in the present invention so as to be depressed in the region between adjacent bump electrodes. As a result, the head portion of each bump electrode is not rendered stationary by the sealing film and, thus, is capable of deformation. It follows that, where the bump electrode is bonded to a terminal of another electronic appliance, the stress generated by the difference in thermal expansion coefficient between the two is absorbed by the deformation of the bump electrode. It should be noted that, in the present invention, the sealing film is formed by reciprocating a squeegee, which is held vertical, having a sharp tip portion. It follows that the thickness of the sealing film can be controlled easily by adjusting the pushing amount of the tip portion of the squeegee into the clearance between adjacent bump electrodes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of sealing bump electrodes, comprising:
   preparing a substrate having a number of bump electrodes formed apart from each other;
   mounting on said substrate a mask having at least one open portion corresponding to at least a part of a region between adjacent ones of the bump electrodes; and
   forming a sealing film having a thickness smaller than a height of the bump electrodes on the substrate by moving at least one squeegee onto the mask.

2. A method of sealing bump electrodes according to claim 1, further comprising dicing said substrate after formation of said sealing film.

3. A method of sealing bump electrodes according to claim 1, wherein said squeegee is moved downward in the region between the adjacent ones of the bump electrodes to a position lower than an upper surface of each of said bump electrodes.

4. A method of sealing bump electrodes according to claim 1, wherein said mask is formed such that a thickness of at least a region corresponding to substantially an entire region of said substrate with the exception of a peripheral portion of said substrate is smaller than the height of the bump electrodes.

5. A method of sealing a bump electrode according to claim 1, wherein said mask as a whole is formed to have a thickness substantially smaller than the height of said bump electrodes.

6. A method of sealing a bump electrode according to claim 1, wherein said mask includes a thin wall portion positioned on top of the bump electrodes, said thin wall portion having a thickness smaller than the height of said bump electrodes and a length larger than a length of said squeegee.

7. A method of sealing a bump electrode according to claim 6, wherein said squeegee is moved along said mask while making a vertical movement relative to said substrate.

8. A method of sealing a bump electrode according to claim 1, wherein said mask includes a concave portion formed in substantially an entire region corresponding to said substrate with the exception of a peripheral region of said substrate.

9. A method of sealing a bump electrode according to claim 8, wherein said mask includes a thin wall portion positioned within the concave portion, located to correspond to each of the bump electrodes, and having an area larger than an upper surface of each of the bump electrodes.

10. A method of sealing a bump electrode according to claim 1, wherein said squeegee has a sharp tip portion.

11. A method of sealing a bump electrode according to claim 10, wherein an angle in the tip portion of the squeegee falls within a range of between 55° and 80°.

12. A method of sealing a bump electrode according to claim 10, wherein the tip portion of said squeegee is substantially V-shaped and left and right portions of the tip portion are in symmetry with respect to a vertical plane including a boundary between said left and right portions.

13. A method of sealing a bump electrode according to claim 10, wherein said squeegee is moved along the mask while maintaining a substantially vertical posture.

14. A method of sealing a bump electrode according to claim 8, wherein said squeegee is reciprocated to form the sealing film in a gap between the adjacent ones of the bump electrodes.

15. A method of sealing a bump electrode according to claim 14, wherein a pair of squeegees are moved along the mask.

16. A method of sealing a bump electrode according to claim 15, wherein the squeegees are moved along the mask in a moving direction such that a forward squeegee positioned ahead in the moving direction is located apart from the mask and a rearward squeegee positioned behind in the moving direction is in contact with the mask.

17. A method of sealing a bump electrode according to claim 16, wherein the pair of squeegees are brought in contact with the mask at a location where the mask is positioned outside the substrate.

18. A method of sealing bump electrodes comprising:

preparing a semiconductor substrate having a number of bump electrodes formed apart from each other;

mounting a mask to said semiconductor substrate, said mask having at least one open portion exposing at least a part of regions between adjacent ones of the bump electrodes and said mask having a region corresponding to said semiconductor substrate, wherein a thickness of said region of said mask is smaller than a height of each of the bump electrodes;

forming a sealing resin film having a thickness smaller than the height of each of the bump electrodes on the substrate by moving at least one squeegee having a sharp tip portion along the mask; and dicing said semiconductor substrate.

19. A method of sealing bump electrodes according to claim 18, wherein said sealing resin has a viscosity falling within a range of between 1000 cPS and 300,000 cPS.

20. A method of sealing bump electrodes according to claim 18, wherein the tip portion of said squeegee has an angle of 55° to 80°.

\* \* \* \* \*